(12) United States Patent
Payne et al.

(10) Patent No.: US 8,580,149 B2
(45) Date of Patent: Nov. 12, 2013

(54) BARIUM IODIDE AND STRONTIUM IODIDE CRYSTALS AND SCINTILLATORS IMPLEMENTING THE SAME

(75) Inventors: Stephen A. Payne, Castro Valley, CA (US); Nerine J. Cherepy, Oakland, CA (US); Giulia E. Hull, Rome (IT); Alexander D. Drobshoff, Livermore, CA (US); Arnold Burger, Nashville, TN (US)

(73) Assignees: Lawrence Livermore National Security, LLC, Livermore, CA (US); Fisk University, Nashville, TN (US)

( * ) Notice: Subject to any disclaimer, the term of this patent is extended or adjusted under 35 U.S.C. 154(b) by 1376 days.

(21) Appl. No.: 12/255,375

(22) Filed: Oct. 21, 2008

(65) Prior Publication Data
US 2010/0044576 A1    Feb. 25, 2010

Related U.S. Application Data

(60) Provisional application No. 60/988,475, filed on Nov. 16, 2007.

(51) Int. Cl.
*C09K 11/08*    (2006.01)
*C09K 11/61*    (2006.01)

(52) U.S. Cl.
USPC .................................................. 252/301.4 H

(58) Field of Classification Search
USPC .................. 252/301.4 H, 301.4 F, 301.17; 250/370.11
See application file for complete search history.

(56) References Cited

U.S. PATENT DOCUMENTS

| | | | | |
|---|---|---|---|---|
| 3,373,279 A | * | 3/1968 | Hofstadter | 250/483.1 |
| 4,587,555 A | * | 5/1986 | Carollo et al. | 378/98.5 |
| 4,999,515 A | * | 3/1991 | Nakamura et al. | 250/484.4 |
| 2007/0170396 A1 | * | 7/2007 | Appleby et al. | 252/301.4 F |
| 2010/0268074 A1 | * | 10/2010 | Van Loef et al. | 600/431 |
| 2011/0165422 A1 | * | 7/2011 | Gundiah et al. | 428/402 |

FOREIGN PATENT DOCUMENTS

JP    04126791 A    *    4/1992

OTHER PUBLICATIONS

New World Encyclopedia entry for Europium (http://www.newworldencyclopedia.org/entry/Europium).*
The Free Dictionary Online (Collins English Dictionary—definition of scintillator, http://www.thefreedictionary.com/scintillator).*
V. Goryushkin et al., "A thermographic study of gadolinium iodide" Rus, J. Inorg. Chem 37, 994 (1992).

(Continued)

*Primary Examiner* — Emily M Le
*Assistant Examiner* — Lynne Edmondson
(74) *Attorney, Agent, or Firm* — Dominic M. Kotab

(57) ABSTRACT

In one embodiment, a material comprises a crystal comprising strontium iodide providing at least 50,000 photons per MeV. A scintillator radiation detector according to another embodiment includes a scintillator optic comprising europium-doped strontium iodide providing at least 50,000 photons per MeV. A scintillator radiation detector in yet another embodiment includes a scintillator optic comprising $SrI_2$ and $BaI_2$, wherein a ratio of $SrI_2$ to $BaI_2$ is in a range of between 0:1 A method for manufacturing a crystal suitable for use in a scintillator includes mixing strontium iodide-containing crystals with a source of $Eu^{2+}$, heating the mixture above a melting point of the strontium iodide-containing crystals, and cooling the heated mixture near the seed crystal for growing a crystal. Additional materials, systems, and methods are presented.

5 Claims, 8 Drawing Sheets

(56) References Cited

OTHER PUBLICATIONS

J. Selling et al., "Europium-doped barium halide scintillators for x-ray and y-ray detections." J. Appln. Phys., 101, 034901 (2007).
Von Barnighausen et al., Die Kristallstruktur der monoklinen Form von Europium (II)-iodid $EuI_2$ Acta Cryst. (1969). B25, 1104.
Brackett EB et al., "The crystal structures of $BaCl_2$, $BaCr_2$ and $BaI^{2}$" J. Phys, Chem., 67, 2132, (1963).
W. Moses et al., "Potential for $RbGd_2Br_7$:Ce, $LaCl_3$:Ce, $LaBr_3$:Ce, and $LuI_3$:Ce in nuclear medical imaging" Nucl. Instr. Meth. A537, 317-320 (2005).
A. Bessiere et al., "Luminescence and scintillation properties of the small band gap compound $LaI_3$:$Ce^3$+," Nucl. Instr. Meth A537, 22-26 (2005).
"Bridgman-Stockbarger technique" http://en.wikipedia.org/wiki/Bridgman-Stockbarger_technique.
Novosad, S., "Scintillation characteristics of thin-film calcium iodide crystal x-ray detectors" Technical Physics, vol. 43, No. 8, Aug. 1998.
Lehmann, Willi, "Heterogeneous Halide-Silica Phosphors" J. Electrochem. Soc., vol. 122, Issue 6, Jun. 1975.
Glodo et al., "Scintillation properties of $LuI_3$:Ce" ScienceDirect.
Hofstadter et al., "$CaI_2$ and $CaI_2$(Eu) Scintillation Crystals" IEEE Transactions on Nuclear Science, Jun. 1964.
"Determination of Europium (II) and Total Europium in Europium-Activated Lithium Iodide Scintillation Crystals," Analytical Chemistry, vol. 36, No. 10, Sep. 1964, pp. 2042-2044.

\* cited by examiner

| Scintillator | P (g/cm³) | $Z_{eff}$[a] | Emission Peak (nm) | Estimated Band Gap, $E_g$[b] (eV) | Theoretical Maximum LY[d] (Ph/MeV) | Measured β LY (Ph/MeV) | Measured γ LY (Ph/MeV) | Measured Resolution (662 keV) |
|---|---|---|---|---|---|---|---|---|
| SrI₂ undoped | 4.549 | 49.4 | 560 | 3.7 | 111,000 | 62,000 | 22,000 | 6.7% |
| SrI₂ (Eu, 6%) | 4.549 | 49.4 | 435 | 3.7 | 111,000 | 110,000 | 115,000 | 2.8% |
| SrBr₂ (Eu, 0.5%) | 4.216 | 36.1 | 410 | 4.0 | 100,000 | 25,000 | 20,000 | 7% |
| BaI₂ (Eu, 0.5%) | 5.150 | 54.1 | 422 | 3.9 | 103,000 | 40,000 | 35,000 | 8% |
| BaBr₂ (Eu, 0.1%) | 4.781 | 45.5 | 406 | 4.1 | 98,000 | 22,000 | 16,000 | 11% |
| CaI₂ (Eu, 0.5%) | 4.000 | 48.0 | 467 | 3.5 | 114,000 | 110,000 | 110,000 | 5.2% |
| LaBr₂ (Ce) | 5.080 | 44.1 | 360 | 4.5 | 89,000 | 60,000 | 60,000 | 2.6% |

FIG. 5

BARIUM IODIDE AND STRONTIUM IODIDE CRYSTALS AND SCINTILLATORS IMPLEMENTING THE SAME

RELATED APPLICATIONS

This application claims priority to provisional U.S. application Ser. No. 60/988,475 filed on Nov. 16, 2007, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to scintillator crystals, and more particularly to ionic iodide-containing crystals and scintillator detectors employing the same.

BACKGROUND

Detection and classification of gamma ray emitters has attained heightened importance in the protection of vulnerable targets and populaces from high energy explosives. Many nuclear explosives emit gamma rays, due to radioactive decay of the materials comprising the explosives. However, many less harmful and non-explosive materials also emit gamma rays. Therefore, it is desirable to be able to identify, and whenever possible, distinguish between the types of gamma ray emitters in an unknown material, possibly further concealed inside of a container or vehicle of some type, such as a car, van, cargo container, etc.

Many types of materials emit-gamma rays that appear very close together on a gamma spectrograph. Scintillator detectors use crystals that emit light when gamma rays interact with the atoms in the crystals. The intensity of the light emitted can be used to determine the type of material that is emitting the gamma rays. Scintillator detectors may also be used to detect other types of radiation, such as alpha, beta, and x-rays. High energy resolution scintillator detectors are useful for resolving closely spaced gamma ray lines in order to distinguish between gamma emitters producing closely spaced gamma ray lines.

Detection sensitivity for weak gamma ray sources and rapid unambiguous isotope identification is principally dependent on energy resolution, and is also enhanced by a high effective atomic number of the detector material. Generally, gamma ray detectors are characterized by their energy resolution. Resolution can be stated in absolute or relative terms. For consistency, all resolution terms are stated in relative terms herein. A common way of expressing detector resolution is with Full Width at Half Maximum (FWHM). This equates to the width of the gamma ray peak on a spectral graph at half of the highest point on the peak distribution.

The relative resolution of a detector may be calculated by taking the absolute resolution, usually reported in keV, dividing by the actual energy of the gamma ray also in keV, and multiplying by 100%. This results in a resolution reported in percentage at a specific gamma ray energy. The inorganic scintillator currently providing the highest energy resolution is $LaBr_3(Ce)$, with about 2.6% at 662 keV, but it is highly hygroscopic, its growth is quite difficult and it possesses natural radioactivity due to the presence of primordial $^{138}La$ that produces betas and gamma rays resulting in interference in the gamma ray spectra acquired with $LaBr_3(Ce)$. Therefore, it is desirable to have a scintillator detector that is capable of distinguishing between weak gamma ray sources that is more easily grown while still providing high energy resolution.

SUMMARY

In one embodiment, a material comprises a crystal comprising strontium iodide providing at least 50,000 photons per MeV.

A scintillator radiation detector according to another embodiment includes a scintillator optic comprising europium-doped strontium iodide providing at least 50,000 photons per MeV.

A scintillator radiation detector in yet another embodiment includes a scintillator optic comprising $SrI_2$ and $BaI_2$, wherein a ratio of $SrI_2$ to $BaI_2$ is in a range of between 0:1

A method for manufacturing a crystal suitable for use in a scintillator is also presented. The method includes mixing strontium iodide-containing crystals with a source of $Eu^{2+}$, heating the mixture above a melting point of the strontium iodide-containing crystals, and cooling the heated mixture near the seed crystal for growing a crystal.

A scintillator radiation detector according to yet another embodiment includes a scintillator optic comprising barium iodide.

An iodide crystal in a further embodiment is comprised of a single metal ion with the formula $MI_2$, $M'I_3$, or $M''I_4$, where M or M' has an atomic number >40, but is not Y, Sc, Gd, La, Lu, Ca, Sr or Ba.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 5 is a chart comparing eight different measured or calculated characteristics for seven different scintillator materials.

DETAILED DESCRIPTION

Figure 1:
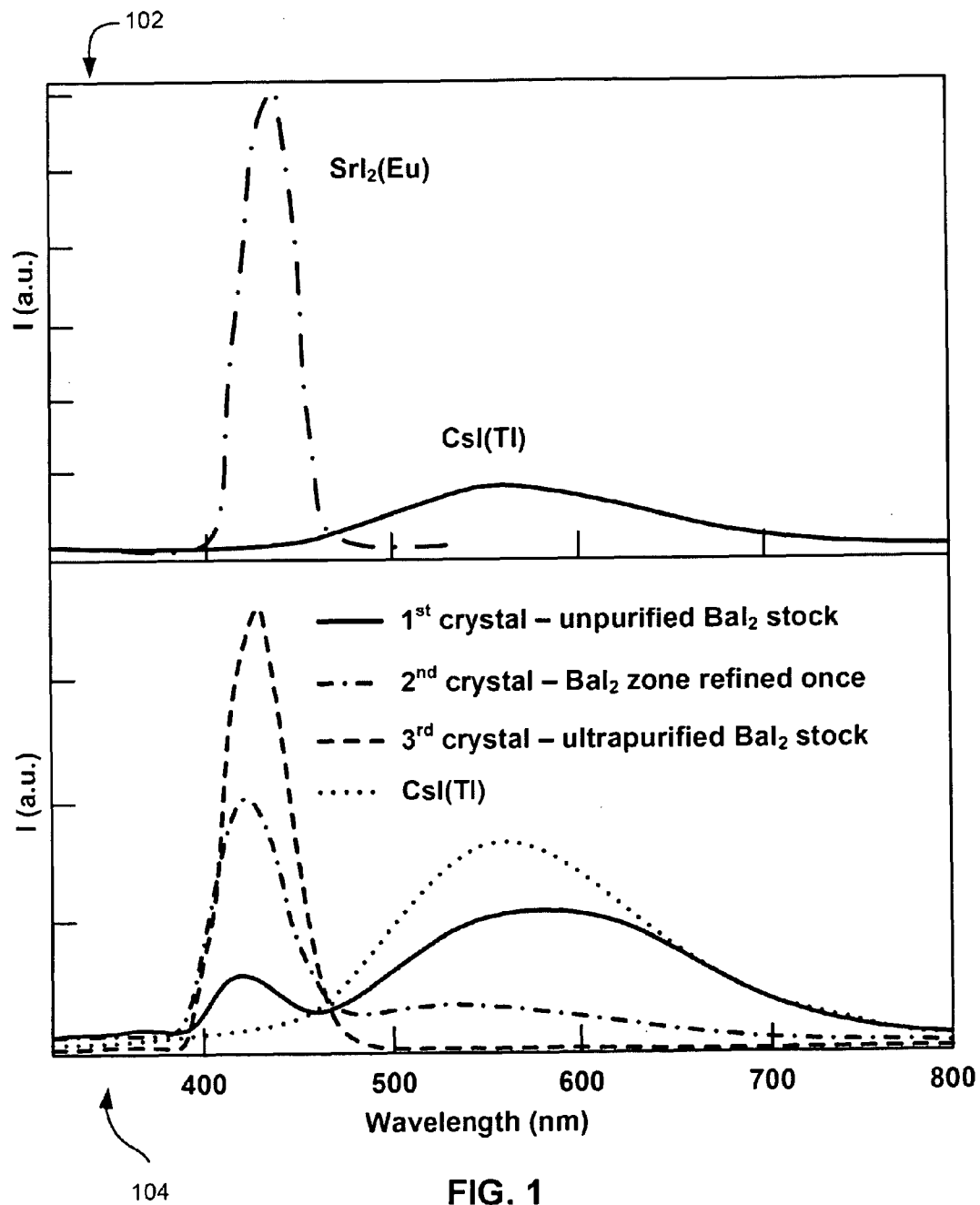
FIG. 1 illustrates two plots of relative intensity versus wavelength for several scintillator samples.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Several crystalline iodides are known to function usefully as scintillators, including NaI(Tl), CsI(Na), CsI(Tl), and LuI$_3$ (Ce). NaI(Tl) is by far the most common scintillator, being grown in large sizes by numerous companies and deployed in many commercial instruments. However, NaI(Tl) offers a modest light yield, which limits the gamma ray energy resolution which is possible (about 40,000 photons/MeV). CaI$_2$ (Eu) and LuI$_3$(Ce) both have higher light yields (about 70,000-100,000 photons/MeV) but are exceedingly difficult to grow and the latter contains Lu as a constituent (which is a natural beta-emitter leading to an undesirable background count rate). Interestingly, LaI$_3$(Ce) has also been tested as a potential scintillator, but was found to be non-emissive at room temperature.

Two materials have been found to have great utility as high energy scintillators: SrI$_2$(Eu) and BaI$_2$(Eu), which may resolve the problems facing the related compounds LuI$_3$(Ce) and CaI$_2$(Eu). Other related compounds currently being used as scintillators include Ce-doped LaCl$_3$ and LaBr$_3$, which both have very high light yields but have a lower atomic number (Z) than the iodides (Z of Cl, Br, I are 17, 35, 53, respectively)—the Z is a critical parameter since gamma photoelectric absorption goes approximately as its fourth power, $Z^4$. As a consequence, iodides are preferred as constituents in scintillators versus bromides and chlorides, assuming other features are comparable.

In one embodiment, a scintillator detector makes use of SrI$_2$ or BaI$_2$ crystals for the purpose of gamma ray detection, based on measuring the amount of scintillation luminescence generated by the material. For this purpose, the crystal may be doped or undoped, giving rise to excitonic (undoped), perturbed excitonic (e.g., Na, Mg, Ca, Sc or other doping of electronically inactive species), or activator luminescence (e.g., $Eu^{2+}$, $Ce^{3+}$, $Pb^{2+}$, $Tl^+$, $Pr^{3+}$).

Undoped SrI$_2$ has a useful light yield, but its energy resolution with standard photomultiplier tubes is only fair, due to its emission being long wavelength. When a $Eu^{2+}$ activator is used, emissions in the blue region are observed. Contrary to conventional wisdom and earlier findings, a scintillator optic comprising SrI$_2$ doped with Eu, especially $Eu^{2+}$, has been found to provide a high energy resolution. For example, a SrI$_2$(Eu) crystal grown by the inventors evidenced an energy resolution of <2.7% at 662 keV, challenging the performance of LaBr$_3$(Ce) obtained under the same conditions.

An intriguing factor appears relevant to the excellent performance of SrI$_2$(Eu). That is, the lattice constants for SrI$_2$ and EuI$_2$ are nearly identical, thus permitting high doping of Eu in SrI$_2$. Other favorable aspects of SrI$_2$ include its low melting point, 538° C., and its orthorhombic crystal structure, which will likely be readily grown to large sizes.

The alpha particle-induced luminescence of BaI$_2$(Eu) is similar to that of Lu$_3$Al$_5$O$_{12}$(Ce), but shifted to shorter wavelength.

A marked advantage of using SrI$_2$ or BaI$_2$ crystals doped with Eu is the relative ease in which the crystals can be grown in large sizes. Another advantage is that SrI$_2$(Eu) and BaI$_2$(Eu) are less hygroscopic than CaI$_2$(Eu) which is an important practical edge in using Sr or Ba instead of Ca.

In a first general embodiment, a material comprises a crystal, which is comprised of strontium iodide (doped or undoped) providing at least 50,000 photons per MeV. In one particularly preferred embodiment, the energy resolution of the crystal may be less than about 5.0% at 662 keV, as being enhanced by doping, e.g., with Ce or Eu.

In the first general embodiment, the crystal may be doped with europium in different percentages, such as containing more than 1.6% europium, containing between about 0.5% and about 8.0% europium, and containing more than 2.0% europium.

Figure 8:
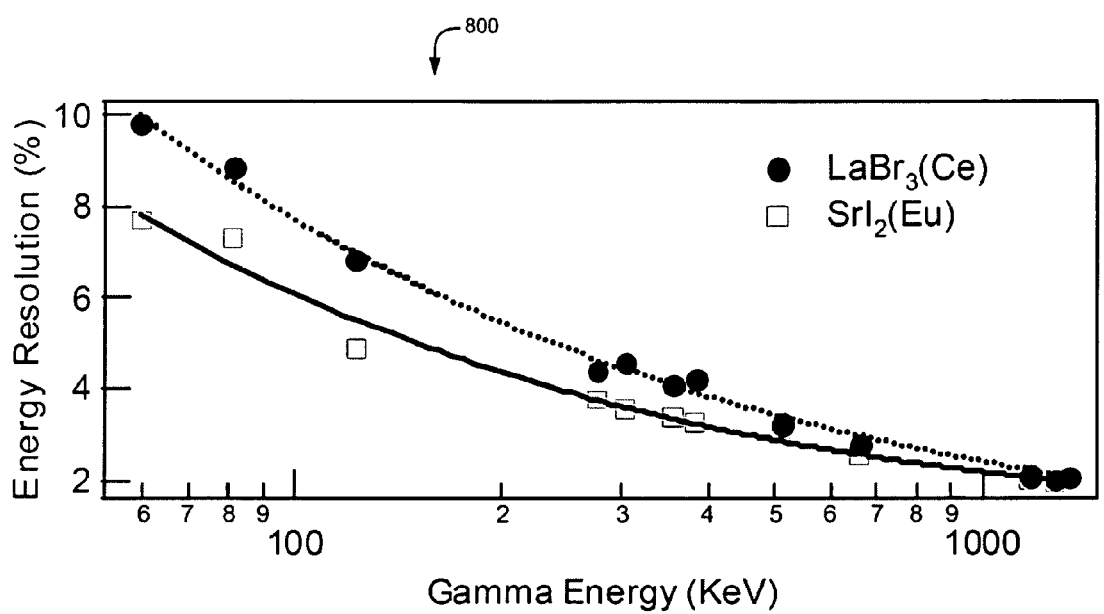
FIG. 8 is a chart of energy resolution as a function of gamma ray energy acquired for $SrI_2(Eu)$ and $LaBr_3(Ce)$ crystals.

In addition, the europium in the crystal may be primarily $Eu^{2+}$. The use of $Eu^{2+}$ surprisingly provides excellent energy resolution, e.g., less than about 2.7% at 662 keV. As noted above, conventional wisdom and a previous report indicated that such energy resolution was impossible for such a material. To exemplify, FIG. 8 is a chart 800 depicting energy resolution as a function of gamma ray energy acquired for SrI$_2$(5% Eu) and LaBr$_3$(Ce) crystals. These crystals are the same as used below in Example 4. As shown, the energy resolution of SrI$_2$(5% Eu) is comparable or slightly better than that of LaBr$_3$(Ce).

Another variation of the first general embodiment is where the crystal has at least one dopant, selected from: cerium, praeseodymium, thallium, or lead.

The first general embodiment may further include barium in the crystal, or the crystal may provide at least 60,000 photons per MeV. Further, the resolution of the crystal may be less than about 5%, less than about 4.0%, etc. at 662 keV.

In a second general embodiment, a scintillator radiation detector comprises a scintillator optic comprised of strontium iodide (doped or undoped) providing at least 50,000 photons per MeV. In one particularly preferred embodiment, the energy resolution of the crystal may be less than about 5.0% at 662 keV.

Also, in the second general embodiment, the scintillator optic may contain more than 1.6% europium, may contain between about 0.5% and about 8.0% europium, or may contain more than 2.0% europium. In addition, the europium may be primarily $Eu^{2+}$. Further, the scintillator optic may include barium and/or calcium.

With continued reference to the second general embodiment, the scintillator optic may provide at least 60,000 photons per MeV, and may have a resolution of less than or about 4.0% at 662 keV.

In a third general embodiment, a scintillator radiation detector comprises a scintillator optic comprised of SrI$_2$ and BaI$_2$, wherein a ratio of SrI$_2$ to BaI$_2$ is in a range of between 0:1 and 1:0.

In the third general embodiment, the scintillator optic may provide at least 50,000 photons per MeV and energy resolution of less than about 5.0% at 662 keV.

Further, the scintillator optic may contain europium, and the europium may be primarily $Eu^{2+}$. In addition, the scintillator optic may provide at least 80,000 photons per MeV, and may contain at least one dopant, selected from: cerium, praeseodymium, thallium, or lead.

In a fourth general embodiment, a scintillator radiation detector comprises a scintillator optic comprising barium iodide.

In the fourth general embodiment, the scintillator optic may be doped with at least one of cerium, praeseodymium, thallium, lead, indium, or a transition metal ion. Also, the scintillator optic may be doped with an activator that luminesces in response to gamma radiation.

In the fourth general embodiment, the activator may include an ion which luminesces via a 5d→4f transition or the activator may include an $s^2$ ion or a closed shell ion. Further, the activator may be a transition metal ion.

In a fifth general embodiment, an iodide crystal comprises a single metal ion (M, M' or M") with the formula $MI_2$, $M'I_3$, or $M''I_4$, where M or M' has an atomic number >40, but is not Y, Sc, La, Lu, Gd, Ca, Sr or Ba. M" may or may not have an atomic number greater than 40.

Any of the general embodiments may include further limitations as directed below. In addition, combinations of the additional limitations directed below may be combined to create even more permutations and combinations of features.

EXAMPLES

To demonstrate various embodiments of the present invention, several examples are provided bellow. It should be appreciated that these are presented by way of nonlimiting example only, and should not be construed as limiting.

Example 1

Strontium iodide and barium iodide crystals were grown in quartz crucibles using the Bridgman method. The melting points of $SrI_2$ and $BaI_2$ are 515 and 711° C., respectively; both possess orthorhombic symmetry while calcium iodide is hexagonal. All crystals described in this section were doped with 0.5 mole % europium and were several cubic centimeters per boule, then cut into ~1 cm³ pieces for evaluation. Barium iodide as-supplied powder, 99.995% pure ultradry (Alfa Aesar) was yellowish in color (thought to be due to oxide or oxyiodide contamination). Crystals grown directly from as-supplied powders retained a dark coloration (referred to henceforth as "first crystal"). Zone refining rendered the starting powders colorless, and the resulting pure powders were used to grow several crystals (referred to as "second crystal," although several were grown following this procedure). Finally, an ultrapurification method was used to grow a $BaI_2$(Eu) crystal, referred to as "third crystal."

Radioluminescence spectra were acquired using a $^{90}Sr/^{90}Y$ source (average beta energy ~1 MeV) to provide a spectrum expected to be essentially equivalent to that produced by gamma excitation. Radioluminescence spectra were collected with a spectrograph coupled to a thermoelectrically cooled camera and corrected for spectral sensitivity. The beta-excited luminescence of $SrI_2$(0.5% Eu) compared to that of a standard scintillator crystal, CsI(Tl), is shown in FIG. 1 in the upper plot 102, along with a $SrI_2$(Eu) crystal grown at RMD. It possesses a single band centered at 435 nm, assigned to the $Eu^{2+}$ d→transition, and an integrated light yield of 93,000 photons/MeV. FIG. 1 in the lower plot 104 shows beta-excited luminescence spectra of three $BaI_2$(Eu) crystals compared to a CsI(Tl) standard crystal. The $Eu^{2+}$ luminescence at ~420 nm is enhanced in the second $BaI_2$(Eu) crystal, while the ~550 nm band is reduced, and for the third crystal, the ~550 nm band is entirely absent. It is notable that the overall light yield is highest for the first crystal; its integral light yield (including both the 420 nm and the 550 nm bands) is 60,000 photons/MeV. The weak band at 550 nm may be assigned to an impurity-mediated recombination transition.

Example 2

Calcium iodide and strontium bromide crystals were grown via the Bridgman method, with 0.5% Europium doping. The $CaI_2$(Eu) crystal is substantially opaque due to optical scatter, considered unavoidable due to its platelet crystal structure. Its radioluminescence spectrum was measured at 110,000 Ph/MeV, and is shown in the chart 200 of FIG. 2. $SrBr_2$(Eu) is an orthorhombic crystal with good optical properties, however, its light yield so far is low (~25,000 Ph/MeV). All radioluminescence spectra reported herein were acquired with a $^{90}Sr/^{90}Y$ source (~1 MeV average beta energy) and emission spectra were collected using a Princeton Instruments/Acton Spec 10 spectrograph coupled to a thermoelectrically cooled CCD camera.

Example 3

Figure 2:
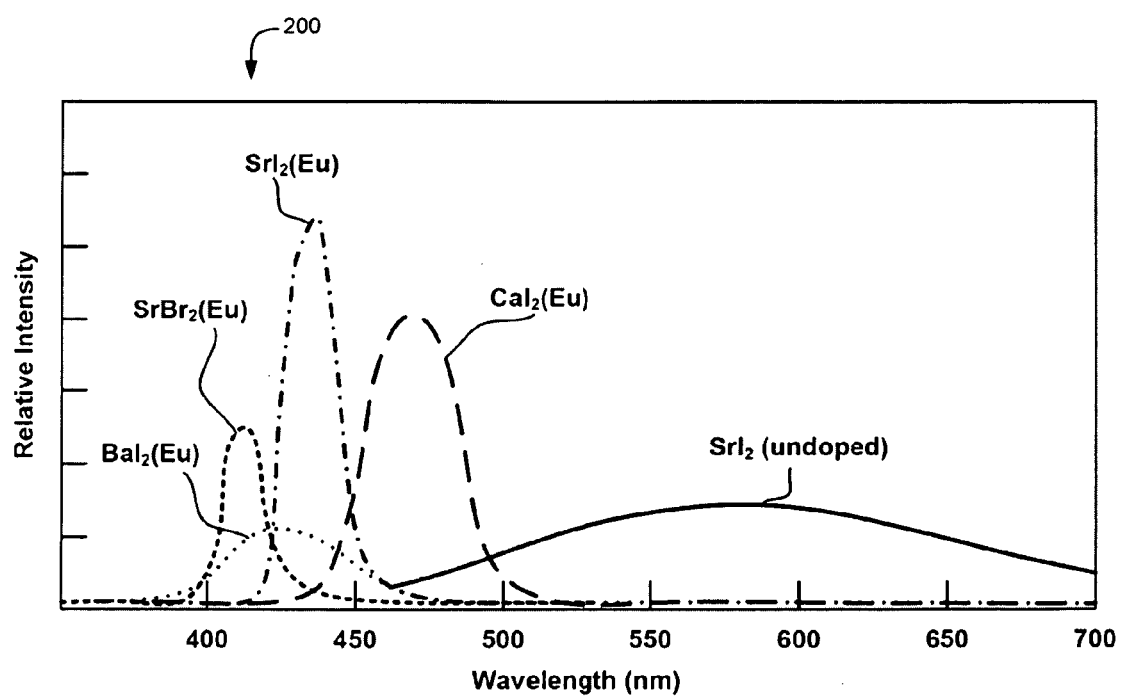
FIG. 2 is a plot of relative intensity versus wavelength for five scintillator samples.
Figure 3:
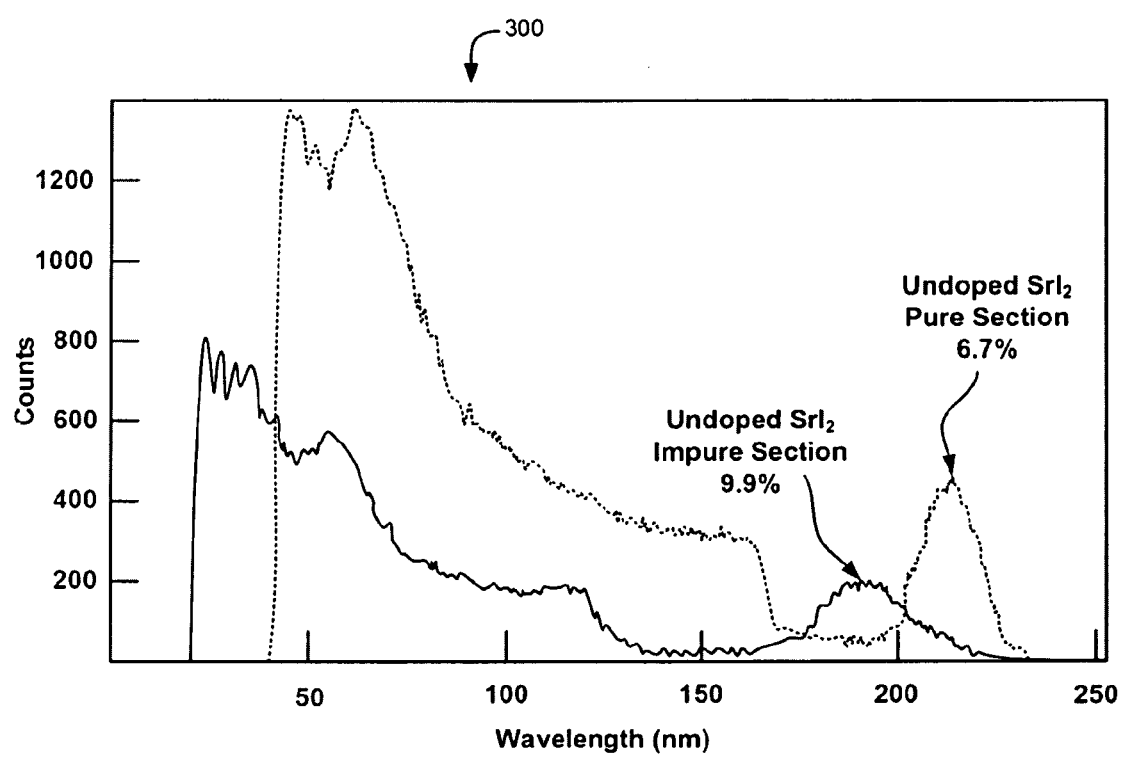
FIG. 3 is a plot of counts versus wavelength for undoped $SrI_2$ in pure and impure forms.

Undoped strontium iodide was grown and zone-refined. The luminescence spectrum, shown in FIG. 2, is unchanged between pure and impure segments of the boule, however, the pulse height spectrum of the purer section is slightly higher. Pulse height measurements, shown in the chart 300 of FIG. 3, were acquired using a Hamamatsu R329EGP PMT (QE at 550 nm of 15%). The signals from the PMT anode were collected on a 500Ω resistor, shaped with a Tennelec TC 244 spectroscopy amplifier (shaping time of 8 μs) and then recorded with the Amptek MCA8000-A multi-channel analyzer. The emission is likely due to self-trapped excitons, as it is present for all un-doped samples.

Example 4

Figure 4A:
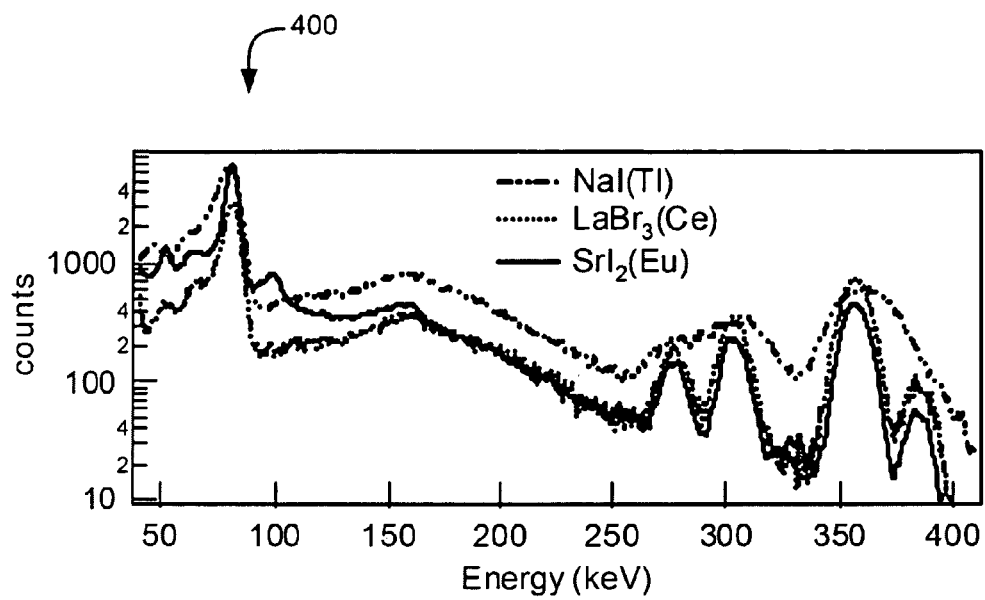
FIG. 4A is a plot of gamma ray spectra acquired with $LaBr_3(Ce)$, $SrI_2(5\% Eu)$, and NiI(Tl) scintillators of the $^{133}Ba$ source.

A scintillator crystal of strontium iodide doped with 5% europium, a scintillator crystal of $LaBr_3$(Ce), and a scintillator crystal of NiaI(Tl) were acquired and exposed to a $^{133}Ba$ source. Acquisition parameters (e.g., shaping time, gain) were optimized for each crystal to give the best results for the particular crystal. The resulting gamma ray spectra are shown in the chart 400 of FIG. 4A. As shown, the energy resolution of the $SrI_2$(Eu) is better than the energy resolution of the $LaBr_3$(Ce) in the low energy region.

Example 5

The same crystals used in Example 4 were exposed to a $^{137}Cs$ source, which is primarily monoenergetic. Again, acquisition parameters (e.g., shaping time, gain) were optimized for each crystal to give the best results for the particular crystal. The resulting gamma ray spectra are shown in the chart 402 of FIG. 4B. As shown, the energy resolution of the $SrI_2$(Eu) is comparable to the energy resolution of the $LaBr_3$(Ce).

Example 6

Figure 4B:
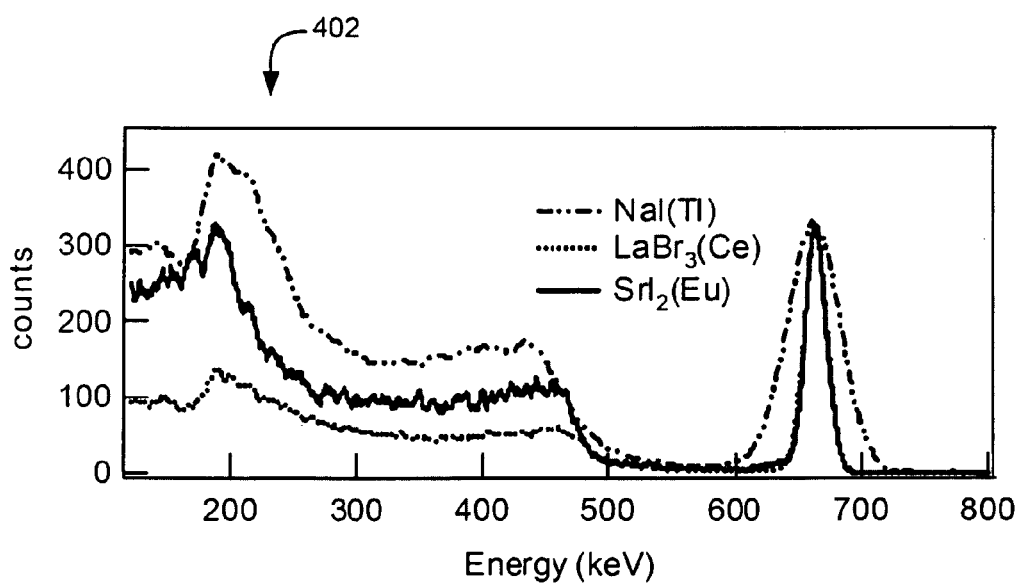
FIG. 4B is a plot of gamma ray spectra acquired with $LaBr_3(Ce)$, $SrI_2(5\% Eu)$, and NiI(Tl) scintillators of the $^{137}Cs$ source.

The same $LaBr_3$(Ce) and $SrI_2$(Eu) crystals used in Example 4 were exposed to a $^{137}Cs$ source, which is primarily monoenergetic. Again, acquisition parameters (e.g., shaping time, gain) were optimized for each crystal to give the best results for the particular crystal. The resulting gamma ray spectra are shown in FIG. 4B. As shown, the energy resolution of the $SrI_2$(Eu) is comparable to the energy resolution of the $LaBr_3$(Ce).

Example 7

Several crystals of barium iodide were grown and characterized. The radioluminescence of $BaI_2$(Eu) typically shows both a long-wave band, similar to that seen in undoped $SrI_2$, as well as the $BaI_2$(Eu) band shown in FIG. 2. The long-wave band, thought to be related to self-trapped exciton luminescence, is reduced as the Eu doping level is increased. However, even for crystals exhibiting only Eu luminescence, gamma light yields and energy resolution so far are modest (see the chart 500 of FIG. 5).

Example 8

Barium Bromide crystals were grown doped with Eu, but the light yields are <30,000 Ph/MeV. While it may be possible for the performance of $BaI_2$ and $BaBr_2$ to be improved, but energetic considerations, such as relative positions of the $Eu^{2+}$ states within the bandgap, may limit light yields. For example, the $Eu^{2+}$ excited state in $BaI_2$ may be too close to the conduction band to compete effectively with residual shallow traps, while this matter is resolved in $SrI_2$ since the $Eu^{2+}$ excited state is slightly lower with respect to the conduction band.

Therefore, of the alkaline earth halides, $SrI_2(Eu)$ appears most promising due to its very high light yield, good optical properties, ease of growth, high achievable doping with $Eu^{2+}$, $Z_{eff}$ higher than $LaBr_3(Ce)$, excellent light yield proportionality and demonstrated energy resolution of <2.7% at 662 keV. $CaI_2$ has not been effectively grown in large sizes and $SrBr_2$ has a low $Z_{eff}$ while $BaI_2$ and $BaBr_2$ have not demonstrated adequate light yields for high energy resolution.

Example 9

Figure 7:
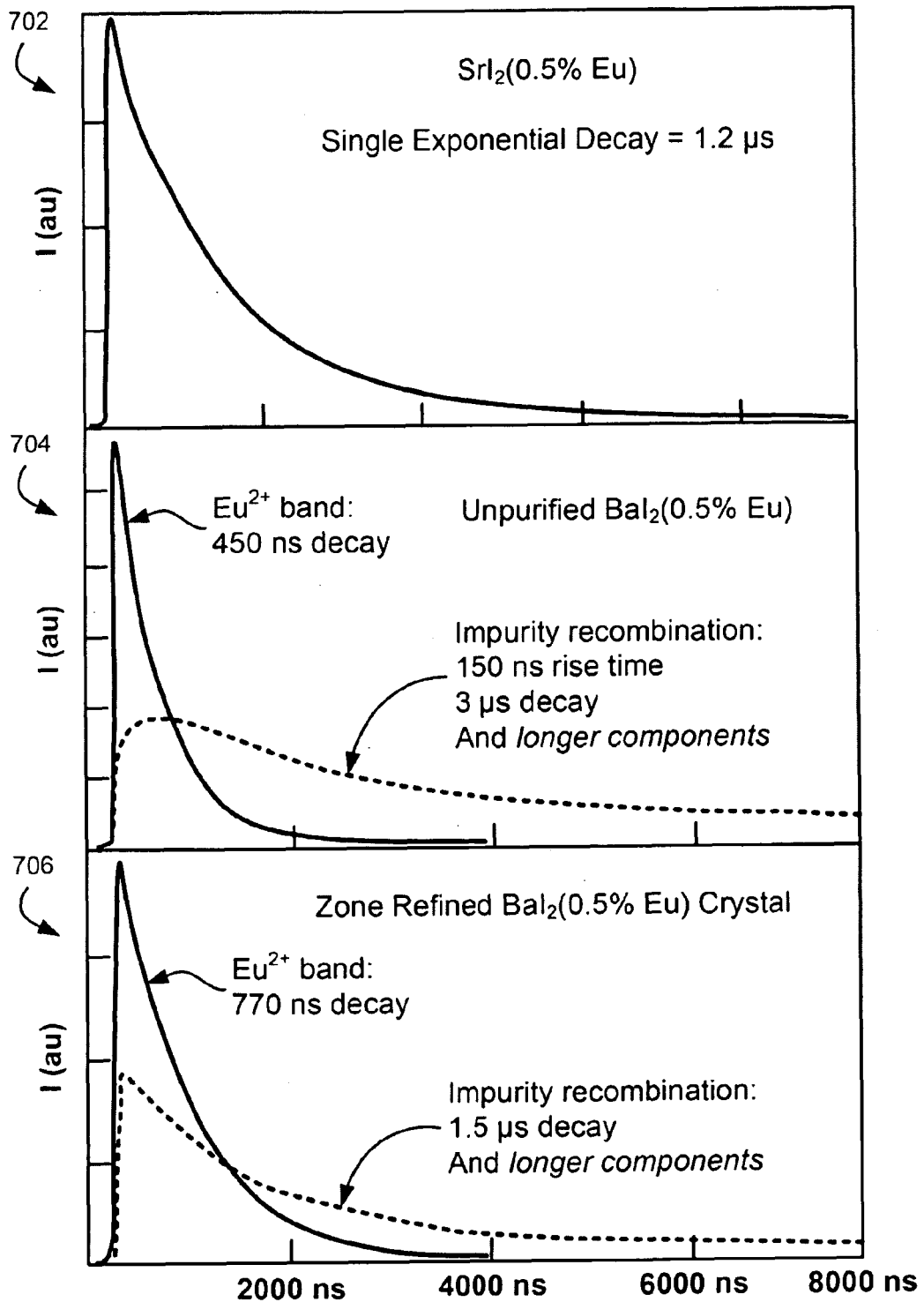
FIG. 7 illustrates three plots of relative intensity versus time for several scintillator samples.

Decay times were acquired using a flashlamp-pumped Nd:YAG laser using the $4^{th}$ harmonic at 266 nm, and 20 ns FWHM pulses. Luminescence was collected with a monochromator coupled to an R928 Hamamatsu PMT and read out by an oscilloscope. In $SrI_2(Eu)$, the $Eu^{2+}$ band decays with a 1.2 microsecond time constant as shown in FIG. 7, top plot 702. FIG. 7, middle plot 704, shows that for the $BaI_2(Eu)$ crystal grown with as-received powder, the $Eu^{2+}$ decay is about 450 ns while the impurity-mediated luminescence is slower, and cannot be fully integrated within an 8 μs shaping time. It is interesting that a component of the impurity-mediated recombination pathway is prompt (pulsewidth-limited) proceeding directly by trapping carriers from the conduction and valence band, but there is also a component that forms by depopulating the $Eu^{2+}$ excited state (possibly electrons trapped initially at $Eu^{2+}$ are able to thermally de-trap to the conduction band), as revealed by a rise-time component observed for 600 nm detection. Also, the impurity-mediated decay is very slow, on the tens of microseconds timescale (perhaps due to an exciton experiencing a triplet to singlet spin-forbidden transition). For ZR $BaI_2(Eu)$, the $Eu^{2+}$ decay is about 770 ns, as shown in FIG. 7, bottom plot 706, effectively lengthened due to the reduction of de-trapping and excitation transfer to the impurity-mediated recombination pathway.

Illustrative Method

Figure 6:
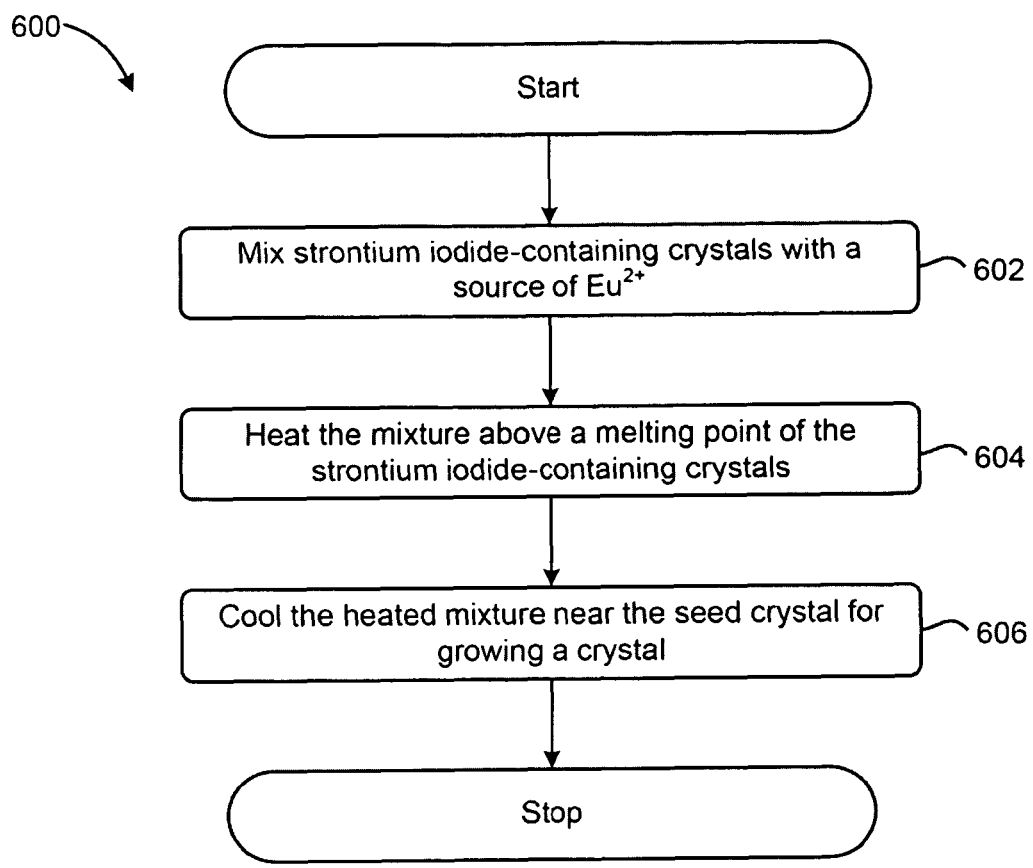
FIG. 6 is a flow chart of a method according to one embodiment.

Now referring to FIG. 6, a method 600 according to one embodiment is shown. As an option, the present method 600 may be implemented in the context and functionality architecture of the preceding descriptions. Of course, the method 600 may be carried out in any desired environment. It should also be noted that the aforementioned definitions may apply during the present description.

With continued reference to FIG. 6, in operation 602, strontium iodide-containing crystals are mixed with a source of $Eu^{2+}$. Any type of strontium iodide-containing crystals may be used, and the source of $Eu^{2+}$ may be of any type.

In operation 604, the mixture is heated above a melting point of the strontium iodide-containing crystals. The melting point may be different than that of $Eu^{2+}$ alone or It may be different than a melting point of strontium iodide-containing crystals alone.

In operation 606, the heated mixture is cooled near the seed crystal for growing a crystal. The grown crystal may contain more than 1.6% europium, more than 2.0% europium, or between about 0.5% and about 8.0% europium. Further, the europium in the grown crystal may be primarily $Eu^{2+}$.

In Use

Embodiments of the present invention may be used in a wide variety of applications, and potentially any application in which high light yield or high resolution is useful.

Illustrative uses of various embodiments of the present invention include, but are not limited to, applications requiring radiation detection. Search, surveillance and monitoring of radioactive materials are a few such examples. Various embodiments can also be used in the nuclear fuel cycle, homeland security applications, nuclear non-proliferation, medical imaging, etc.

Yet other uses include detectors for use in treaty inspections that can monitor the location of nuclear missile warheads in a nonintrusive manner. Further uses include implementation in detectors on buoys for customs agents at U.S. maritime ports, cargo interrogation systems, and instruments that emergency response personnel can use to detect or search for a clandestine nuclear device.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for manufacturing a crystal suitable for use in a scintillator, the method comprising:
    mixing strontium iodide-containing crystals with a material having $Eu^{2+}$;
    heating the mixture above a melting point of the strontium iodide ($SrI_2$)-containing crystals; and
    cooling the heated mixture for growing a scintillator crystal comprising europium-doped strontium iodide providing at least 50,000 photons per MeV,
    wherein the grown crystal contains more than 1.6% europium.

2. The method of claim 1, wherein the grown crystal provides the at least 50,000 photons per MeV when exposed to 662 keV gamma rays.

3. The method of claim 1, wherein the grown crystal contains more than 2% europium.

4. The method of claim 1, wherein the grown crystal contains between about 0.5% and about 8% europium.

5. The method of claim 1, wherein the europium in the grown crystal is primarily $Eu^{2+}$.

* * * * *